(12) United States Patent
You

(10) Patent No.: US 9,780,155 B2
(45) Date of Patent: Oct. 3, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventor: Chungi You, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 23 days.

(21) Appl. No.: 14/860,061

(22) Filed: Sep. 21, 2015

(65) Prior Publication Data

US 2016/0141346 A1    May 19, 2016

(30) Foreign Application Priority Data

Nov. 17, 2014   (KR) .......................... 10-2014-0160055

(51) Int. Cl.

| | |
|---|---|
| *H01L 27/32* | (2006.01) |
| *H01L 29/786* | (2006.01) |
| *H01L 29/66* | (2006.01) |
| *H01L 51/52* | (2006.01) |

(52) U.S. Cl.
CPC ...... *H01L 27/3262* (2013.01); *H01L 27/3246* (2013.01); *H01L 27/3276* (2013.01); *H01L 29/66765* (2013.01); *H01L 29/66772* (2013.01); *H01L 29/78654* (2013.01); *H01L 29/78669* (2013.01); *H01L 29/78678* (2013.01); *H01L 51/5215* (2013.01); *H01L 27/3248* (2013.01); *H01L 27/3265* (2013.01);

(Continued)

(58) Field of Classification Search
CPC ............. H01L 51/0545; H01L 51/0036; H01L 51/0541; H01L 51/5012

See application file for complete search history.

(56) References Cited

U.S. PATENT DOCUMENTS

| | | | |
|---|---|---|---|
| 7,893,440 B2* | 2/2011 | Kwon ................. | H01L 27/1255 257/40 |
| 8,289,491 B2* | 10/2012 | Lee ..................... | G02F 1/13454 349/147 |
| 2009/0302332 A1 | 12/2009 | Kang et al. | |

(Continued)

FOREIGN PATENT DOCUMENTS

| | | |
|---|---|---|
| KR | 10-2009-0127715 A | 12/2009 |
| KR | 10-2013-0080642 A | 7/2013 |

*Primary Examiner* — Quoc Hoang

(74) *Attorney, Agent, or Firm* — Knobbe Martens Olson & Bear LLP

(57) ABSTRACT

An organic light-emitting display apparatus includes a substrate, an active layer of a thin film transistor formed over the substrate, a gate insulating layer formed over the active layer, a gate electrode of the thin film transistor formed over the gate insulating layer, an interlayer insulating layer formed over the gate electrode and the first electrode, a source electrode and a drain electrode formed over the interlayer insulating layer, a pixel electrode including a first region in direct contact with an upper surface of the interlayer insulating layer and a second region in direct contact with an upper surface of one of the source electrode and the drain electrode, a pixel defining layer covering the source and drain electrodes and including an opening which exposes the first region of the pixel electrode in an area that does not overlap the thin film transistor.

18 Claims, 5 Drawing Sheets

(52) U.S. Cl.
CPC .... *H01L 51/5203* (2013.01); *H01L 2227/323* (2013.01); *H01L 2251/558* (2013.01)

(56) References Cited

U.S. PATENT DOCUMENTS

2013/0175533 A1    7/2013   Lee et al.
2013/0280836 A1   10/2013   Ghosh et al.

\* cited by examiner

ORGANIC LIGHT-EMITTING DISPLAY APPARATUS AND METHOD OF MANUFACTURING THE SAME

RELATED APPLICATION

This application claims the benefit of Korean Patent Application No. 10-2014-0160055, filed on Nov. 17, 2014, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Art

Generally, an organic light-emitting display apparatus includes a hole injection electrode, an electron injection electrode, and an organic emission layer formed between the hole injection electrode and the electron injection electrode. Also, the organic light-emitting display apparatus is a self-emitting display apparatus in which light is emitted as holes injected from the hole injection electrode and electrons injected from the electron injection electrode recombine and become extinct in the organic emission layer. The organic light-emitting display apparatus is being noted as a next-generation display apparatus because of its excellent features such as low power consumption, high brightness, and a fast response time.

SUMMARY

One or more embodiments include an organic light-emitting display apparatus which may have reduced manufacturing costs and a method of manufacturing the organic light-emitting display apparatus.

Additional aspects will be set forth in part in the description which follows and, in part, will be apparent from the description, or may be learned by practice of the presented embodiments.

One aspect provides an organic light-emitting display apparatus comprising: a substrate comprising a major surface; an active layer formed over the substrate; a gate insulating layer formed over the active layer; a gate electrode formed over the gate insulating layer for providing a thin-film transistor comprising the gate electrode and the active layer; a first capacitor electrode formed over the gate electrode; an interlayer insulating layer formed over the gate insulation layer, the gate electrode and the first electrode; a source electrode and a drain electrode formed over the interlayer insulating layer; a second capacitor electrode formed over the interlayer insulating layer for providing a capacitor comprising the first and second capacitor electrode, the second capacitor electrode being formed of the same material as the source electrode and the drain electrode; a pixel electrode comprising a first portion formed on and directly contacting an upper surface of the interlayer insulating layer and a second portion connecting the first portion and one of the source electrode and the drain electrode; a pixel defining layer formed over the interlayer insulating layer and covering the source and drain electrodes and the second capacitor electrode, the pixel defining layer comprising an opening which at least partly exposes the first portion of the pixel electrode therethrough, wherein the opening does not overlap any of the active layer, the gate electrode, the first capacitor electrode and the second capacitor electrode when viewed in a viewing direction perpendicular to the major surface; an organic light emission layer formed over the pixel electrode; and an opposite electrode formed over the organic light emission layer.

In the foregoing apparatus, the pixel electrode may be a semi-transmissive electrode, and the opposite electrode may be a reflective electrode, wherein the opposite electrode is more reflective than the pixel electrode and the pixel electrode is more transmissive than the opposite electrode. The pixel electrode may comprise a first transparent conductive oxide layer, a semi-transmissive metal layer, and a second transparent conductive oxide layer that are sequentially stacked over the substrate. The first and second transparent conductive oxide layers may comprise at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO). The semi-transmissive metal layer may comprise one selected from silver (Ag) and an Ag alloy. The interlayer insulating layer may comprise a silicon oxide film and a silicon nitride film that are sequentially stacked over the substrate such that the silicon oxide film is disposed between the substrate and the silicon nitride film.

The foregoing apparatus may further comprise a pad electrode formed over the interlayer insulating layer and formed of the same material as the source electrode, the drain electrode, and the second capacitor electrode. The pixel defining layer may cover an edge portion of the pad electrode. The pixel defining layer may comprise a first portion covering the edge portion of the pad electrode and a second portion covering the source electrode and the drain electrode, wherein the first portion is substantially thinner than the second portion. The pixel defining layer may comprise an organic insulating material.

Another aspect provides a method of manufacturing an organic light-emitting display apparatus, the method comprising: forming an active layer over a substrate; forming a gate insulating layer over the substrate and the active layer; forming a gate electrode and a first capacitor electrode over the gate insulating layer, thereby providing a thin film transistor comprising the active layer and the gate electrode; forming an interlayer insulating layer over the gate insulating layer, the gate electrode and the first capacitor layer; forming a source electrode, a drain electrode, and a second capacitor electrode over the interlayer insulating layer; forming a pixel electrode over the interlayer insulating layer, the pixel electrode comprising a first portion formed on and directly contacting an upper surface of the interlayer insulating layer and a second portion connecting the first portion and one of the source electrode and the drain electrode; and forming a pixel defining layer over the interlayer insulating layer, the pixel defining layer covering the source electrode, the drain electrode, and an edge portion of the pixel electrode.

In the foregoing method, after forming the gate electrode, a region of the active layer that does not overlap the gate electrode when viewed in a viewing direction perpendicular to a major surface of the substrate may be doped with an ion impurity. The pixel defining layer may comprise an opening at least partly exposing the first portion of the pixel electrode therethrough, wherein the opening does not overlap any of the active layer, the gate electrode, the first capacitor electrode and the second capacitor electrode when viewed in a viewing direction perpendicular to a major surface of the substrate. The foregoing method may further comprise: forming a light emission layer over the pixel electrode; and forming an opposite electrode over the light emission layer, wherein the pixel electrode is a semi-transmissive electrode and an opposite electrode is a reflective electrode, wherein the opposite electrode is more reflective than the pixel electrode and the pixel electrode is more transmissive than the opposite electrode.

In the foregoing method, the pixel electrode may comprise a first transparent conductive oxide layer, a semi-transmissive metal layer, and a second transparent conductive oxide layer that are sequentially stacked over the interlayer insulating layer. The semi-transmissive metal layer may comprise one selected from silver (Ag) and an Ag alloy. The first and second transparent conductive oxide layers may comprise at least one selected from a group consisting of ITO, IZO, ZnO, In$_2$O$_3$, IGO, and AZO. When forming the source electrode, the drain electrode, and the second capacitor electrode, a pad electrode, the source electrode, the drain electrode, and the second capacitor electrode may be simultaneously formed over the interlayer insulating layer. The pixel defining layer may comprise a first portion covering the edge portion of the pad electrode and a second portion covering the source electrode and the drain electrode, wherein the first portion is substantially thinner than the second portion. The first portion of the pixel defining layer may be formed by using a half-tone mask.

A further aspect provides an organic light-emitting display apparatus comprising a substrate, and a thin film transistor and a capacitor formed over the substrate. The apparatus further comprises an interlayer insulating layer and a pixel defining layer formed over the pixel defining layer and covering the transistor and the capacitor. The apparatus comprises a pixel electrode comprising a first portion formed on and directly contacting an upper surface of the interlayer insulating layer and a second portion connecting the first portion and one of source and drain electrodes connected to the transistor. The pixel defining layer comprises an opening which at least partly exposes the first portion of the pixel electrode therethrough. The opening does not overlap any one of elements or features of the transistor and the capacitor when viewed in a viewing direction perpendicular to a major surface of the substrate.

According to one or more embodiments, an organic light-emitting display apparatus includes a substrate; an active layer of a thin film transistor formed on the substrate; a gate insulating layer formed on the active layer; a gate electrode of the thin film transistor and a first electrode of a capacitor which are formed on the gate insulating layer; an interlayer insulating layer formed on the gate electrode and the first electrode; a source electrode and a drain electrode formed on the interlayer insulating layer; a second electrode of the capacitor formed on the same layer as the source electrode and the drain electrode; a pixel electrode including a first region in direct contact with an upper surface of the interlayer insulating layer and a second region in direct contact with an upper surface of one of the source electrode and the drain electrode; a pixel defining layer covering the source and drain electrodes and the second electrode and including an opening which exposes the first region of the pixel electrode in an area that does not overlap the thin film transistor or the capacitor; an organic emission layer formed on the pixel electrode; and an opposite electrode formed on the organic emission layer.

The pixel electrode may be a semi-transmissive electrode and the opposite electrode may be a reflective electrode.

The pixel electrode may be of a structure in which a first transparent conductive oxide layer, a semi-transmissive metal layer, and a second transparent conductive oxide layer are sequentially stacked from the substrate.

The first and second transparent conductive oxide layers may include at least one selected from a group including indium tin oxide (ITO), indium zinc oxide (IZO), zinc oxide (ZnO), indium oxide (In$_2$O$_3$), indium gallium oxide (IGO), and aluminum zinc oxide (AZO).

The semi-transmissive metal layer may include one selected from silver (Ag) and an Ag alloy.

The interlayer insulating layer may be of a structure in which a silicon oxide film and a silicon nitride film are sequentially stacked from the substrate.

The apparatus may further include a pad electrode formed on the same layer as the source electrode, the drain electrode, and the second electrode.

The pixel defining layer may cover an end portion of the pad electrode.

A portion of the pixel defining layer that covers the end portion of the pad electrode may be thinner than a portion of the pixel defining layer that covers the source electrode and the drain electrode.

The pixel defining layer may include an organic insulating material.

According to one or more embodiments, a method of manufacturing an organic light-emitting display apparatus includes a first mask process of forming an active layer of a thin film transistor on a substrate; a second mask process of forming a gate insulating layer on a result of the first mask process and forming a gate electrode of the thin film transistor and a first electrode of a capacitor on the gate insulating layer; a third mask process of forming an interlayer insulating layer on a result of the second mask process and exposing a portion of the active layer; a fourth mask process of forming a source electrode, a drain electrode, and a second electrode of the capacitor on a result of the third mask process; a fifth mask process of forming a pixel electrode including a first region in direct contact with an upper surface of the interlayer insulating layer and a second region in direct contact with an upper surface of one of the source electrode and the drain electrode on a result of the fourth mask process; and a sixth mask process of forming a pixel defining layer covering the source electrode, the drain electrode, and an end portion of the pixel electrode on a result of the fifth mask process.

After the second mask process, a region of the active layer that does not overlap the gate electrode may be doped with an ion impurity.

In the sixth mask process, an opening exposing the first region of the pixel electrode may be formed in the pixel defining layer, in an area that does not overlap the thin film transistor or the capacitor.

The pixel electrode may be a semi-transmissive electrode and an opposite electrode may be a reflective electrode.

The pixel electrode may be formed by sequentially stacking a first transparent conductive oxide layer, a semi-transmissive metal layer, and a second transparent conductive oxide layer from the interlayer insulating layer.

The semi-transmissive metal layer may include one selected from silver (Ag) and an Ag alloy.

The first and second transparent conductive oxide layers may include at least one selected from a group including ITO, IZO, ZnO, In$_2$O$_3$, IGO, and AZO.

In the fourth mask process, a pad electrode may be formed on the same layer as the source and drain electrodes simultaneously.

In the sixth mask process, a portion of the pixel defining layer that covers the edge portion of the pad electrode may be thinner than a portion of the pixel defining layer that covers the source electrode and the drain electrode.

In the sixth mask process, the pixel defining layer may be formed by using a half-tone mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
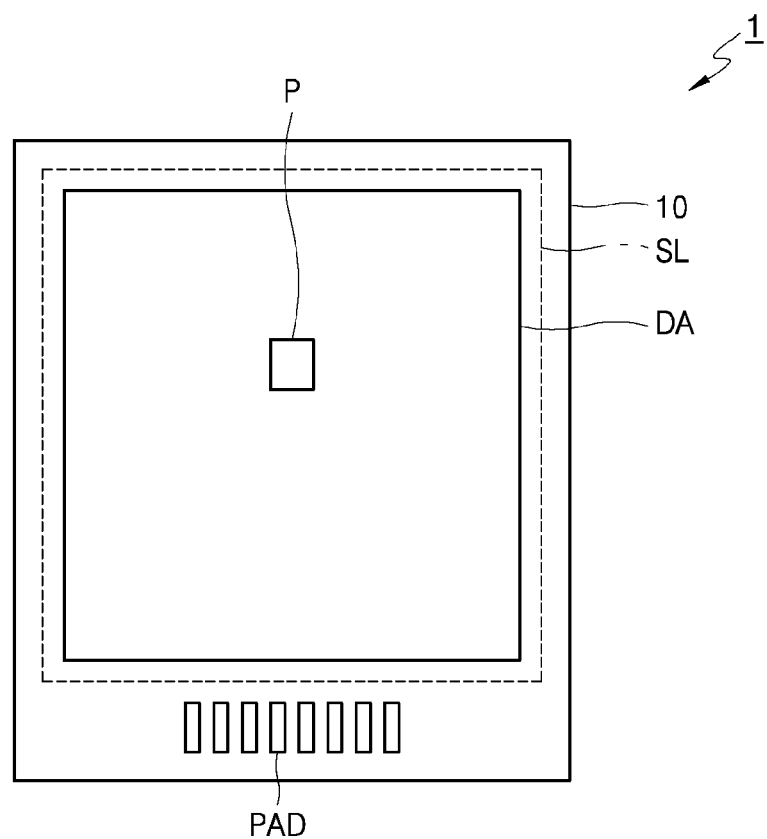
FIG. 1 is a schematic plan view of an organic light-emitting display apparatus according to an embodiment.

As the inventive concept allows for various changes and numerous embodiments, embodiments will be illustrated in the drawings and described in detail in the written description. The effect and feature of the inventive concept and methods of accomplishing the same will become apparent from the following description of the embodiments in detail, taken in conjunction with the accompanying drawings. The inventive concept may, however, be embodied in many different forms and should not be construed as limited to the embodiments set forth herein.

Hereinafter, the inventive concept will be described in detail with reference to the accompanying drawings, in which embodiments are shown. Like reference numerals in the drawings denote like elements, and thus a repeated description thereof will be omitted.

While such terms as "first" and "second" may be used to describe various components, such components must not be limited to the above terms. The above terms are used only to distinguish one component from another.

As used herein, the singular forms "a," "an," and "the" are intended to include the plural forms as well, unless the context clearly indicates otherwise.

It will be understood that the terms such as "include," "comprise," and "have" used herein specify the presence of stated features or components, but do not preclude the presence or addition of one or more other features or components.

It will be further understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items.

Figure 2:
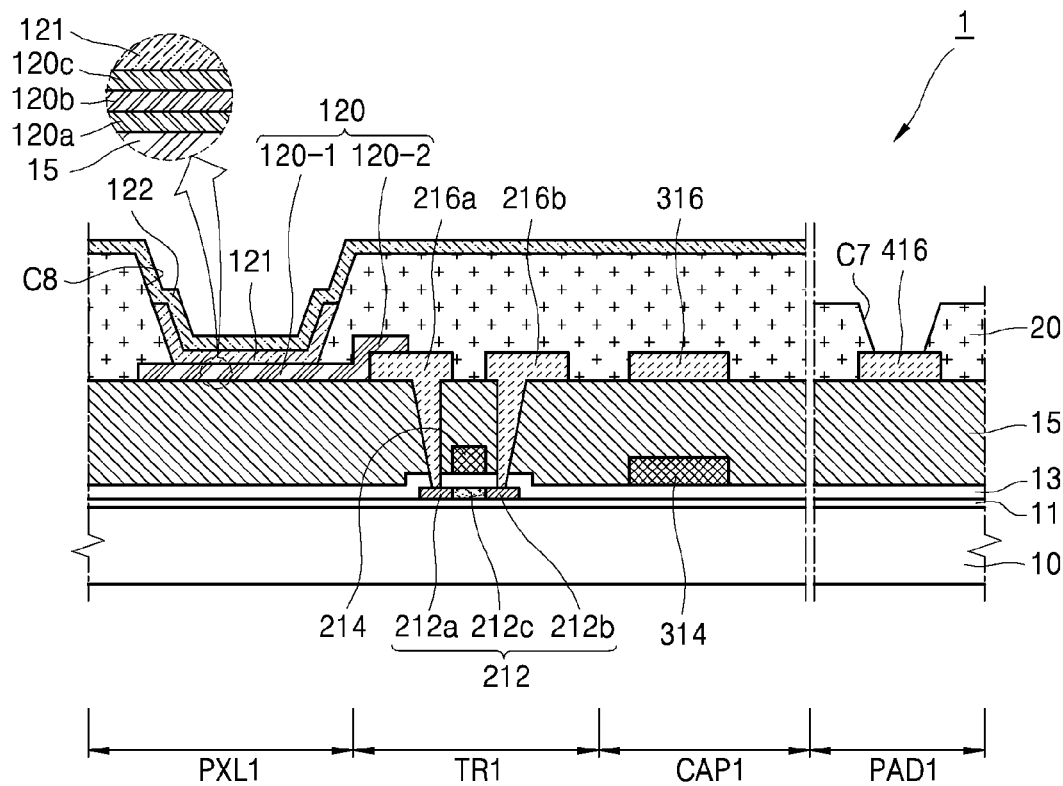
FIG. 2 is a cross-sectional view that schematically illustrates a portion of a light-emitting pixel and a portion of a pad of the organic light-emitting display apparatus of FIG. 1.

FIG. 1 is a schematic plan view of an organic light-emitting display apparatus 1 according to an embodiment. FIG. 2 is a cross-sectional view that schematically illustrates a portion of a light-emitting pixel and a portion of a pad of the organic light-emitting display apparatus 1.

Referring to FIG. 1, a display area DA in which a plurality of pixels P are included to display an image is provided on a substrate 10 of the organic light-emitting display apparatus 1 according to the present embodiment. The display area DA is formed within a sealing line SL when viewed in a viewing direction perpendicular to a major surface of the substrate, and an encapsulating member for encapsulating the display area DA is provided along the sealing line SL. In embodiments, the bottom surface of the substrate may be the major surface, and the viewing direction may be a thickness direction of the substrate.

In embodiments, the plurality of pixels are arranged to form an array. Referring to FIG. 2, when viewed in the viewing direction, each of the plurality of pixels includes a pixel area PXL1 in which at least one organic light emission layer 121 is provided, a transistor area TR1 in which at least one thin film transistor is provided, and a capacitor area CAP1 in which at least one capacitor is provided. The apparatus 1 includes a pad area PAD1.

In the transistor area TR1, an active layer 212 of a thin film transistor is provided on the substrate 10 and a buffer layer 11.

The substrate 10 may be a transparent substrate such as a glass substrate or a plastic substrate including polyethylene terephthalate (PET), polyethylene naphthalate (PEN), or polyimide.

The buffer layer 11 may be further provided to form a planar surface on an upper portion of the substrate 10 and avoid or minimize penetration of an impure element. The buffer layer 11 may be formed of silicon nitride and/or silicon oxide, or the like as a singular layer or plural layers.

The active layer 212 is provided in the thin film transistor area TR1 on the buffer layer 11. The active layer 212 may be formed of a semiconductor including amorphous silicon or crystalline silicon. The active layer 212 may include a channel region 212c, and a source region 212a and a drain region 212b that are arranged at both sides of the channel region 212c and are doped with impurities. The active layer 212 is not limited to amorphous silicon or crystalline silicon and may include an oxide semiconductor.

A gate insulating layer 13 is provided on the active layer 212. The gate insulating layer 13 may be formed of silicon nitride and/or silicon oxide, or the like as a singular layer or plural layers.

A gate electrode 214 is provided on the gate insulating layer 13. The gate electrode 214, for example, may be formed of one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) as a singular layer or plural layers.

In embodiments, a wire such as a scan line, may be formed on the gate insulation layer 13 and formed of the same material as the gate electrode 214 forming a layer of the gate electrode material on the gate insulating layer 13 and then patterning the layer to simultaneously form the gate electrode layer and the scan line. Generally, as a screen size of the organic light-emitting display apparatus 1 becomes larger, the wire needs to be thick such that a signal delay according to an increase in a size of the screen may be prevented. In the present embodiment, the gate electrode 214 and the wire may be formed in a thickness of about 6,000 angstrom (Å) to about 12,000 Å. When the gate electrode 214 and the wire have a thickness of at least 6,000

Å or greater, a signal delay may be avoided or minimized in a large screen of 50 inches or greater. Further, it is possible to form the gate electrode 214 and the wiring that have a thickness smaller than about 12,000 Å by way of deposition without difficulties.

An interlayer insulating layer 15 is positioned on the gate insulation layer 13 and covers the gate electrode 214. The interlayer insulating layer 15 may be formed of silicon nitride or silicon oxide as a singular layer or formed to have plural sub-layers of silicon nitride and silicon oxide.

A source electrode 216a and a drain electrode 216b are provided on the interlayer insulating layer 15. The source electrode 216a and the drain electrode 216b, for example, may be formed of a metal selected from Al, Pt, Pd, Ag, Mg, Au, Ni, Nd, Ir, Cr, Li, Ca, Mo, Ti, W, Cu, and any alloy thereof as a singular layer or plural layers.

A pixel defining layer 20 is formed on the interlayer insulation layer 15 and covers the source electrode 216a and the drain electrode 216b. The pixel defining layer 20 may include a general-purpose polymer such as poly(methyl methacrylate) (PMMA) or polystyrene (PS), a polymer derivative having a phenol group, an acryl-based polymer, an imide-based polymer, an aryl ether-based polymer, an amide-based polymer, a fluorine-based polymer, a p-xylene based polymer, a vinyl alcohol-based polymer, or any blend thereof.

A pixel electrode 120 is connected to one of the source electrode 216a and the drain electrode 216b.

In the pixel area PXL1, the pixel electrode 120 is provided on the interlayer insulating layer 15.

The pixel electrode 120 includes a semi-transmissive metal layer 120b. Also, the pixel electrode 120 may include a first transparent conductive oxide layer 120a formed under the semi-transmissive metal layer 120b, and a second transparent conductive oxide layer 120c formed above the semi-transmissive metal layer 120b.

The semi-transmissive metal layer 120b may be formed of Ag or an Ag alloy. Along with an opposite electrode 122 as a reflective electrode which will be described later, the semi-transmissive metal layer 120b may form a microcavity structure, thereby improving luminescent efficiency of the organic light-emitting display apparatus 1.

The first and second transparent conductive oxide layers 120a and 120c may include at least one selected from a group including indium tin oxide (ITO), indium zinc oxide (IZO), zinc oxide (ZnO), indium oxide ($In_2O_3$), indium gallium oxide (IGO), and aluminum zinc oxide (AZO). The first transparent conductive oxide layer 120a may strengthen adhesion between the interlayer insulating layer 15 and the semi-transmissive metal layer 120b, and the second transparent conductive oxide layer 120c may serve as a barrier layer for protecting the semi-transmissive metal layer 120b.

The pixel electrode 120 includes a first portion or region 120-1 in which its lower surface is in direct contact with an upper surface of the interlayer insulating layer 15, and a second portion or region 120-2 in which its lower surface is in direct contact with an upper surface of one of the source electrode 216a and the drain electrode 216b. Although it is illustrated in FIG. 2 that the second region 120-2 is in direct contact with the source electrode 216a, embodiments are not limited thereto. For example, the second region 120-2 may be in direct contact with the drain electrode 216b.

The first region 120-1 of the pixel electrode 120 is formed in an area that does not overlap either a thin film transistor or a capacitor which will be described later. Accordingly, light that is emitted from an organic emission layer 121 and thus travels through the first region 120-1 may be emitted in a direction toward the substrate 10 without being interrupted by elements or features of the thin film transistor and the capacitor.

In embodiments, edge portions of the first portion 120-1 of the pixel electrode 120 and the second region 120-2 are covered by the pixel defining layer 20.

An opening C8 at least partly exposing the first region 120-1 of the pixel electrode 120 is formed in the area that does not overlap either a thin film transistor or a capacitor when viewed in the viewing direction. A thickness of the pixel defining layer 20 covering the edge portions of the pixel electrode 120, the source electrode 216a, and the drain electrode 216b may range from about 50 μm to about 70 μm.

An intermediate layer including the organic light emission layer 121 is provided on the pixel electrode 120 having an upper surface exposed by the opening C8. The organic light emission layer 121 may be a low molecular organic material or a polymeric organic material.

If the organic emission layer 121 is a low molecular organic material, the intermediate layer may further include a hole transport layer (HTL), a hole injection layer (HIL), an electron transport layer (ETL), and an electron injection layer (EIL). Besides, depending on needs, the intermediate layer may further include various layers. Here, an organic material that may be used may be various, for example, copper phthalocyanine (CuPc), N'-Di(naphthalene-1-yl)-N, N'-diphenyl-benzidine (NPB), or tris-8-hydroxyquinoline aluminum (Alq3).

If the organic emission layer 121 is a polymeric organic material, the intermediate layer may further include an HTL. The HTL may be formed of poly-(2,4)-ethylene-dihydroxy thiophene (PEDOT), polyaniline (PANI), or the like. Here, an organic material that may be used may include polyphenylene vinylene (PPV)-based or polyfluorene-based polymeric organic materials. Also, an inorganic material may be further provided between the organic emission layer 121 and the pixel electrode 120 and between the organic emission layer 121 and the opposite electrode 122.

Although it is illustrated in FIG. 2 that the organic emission layer 121 is positioned on the inside of the opening C8, this is for convenience of description and embodiments are not limited thereto. From the inside of the opening C8, the organic emission layer 121 may extend along an etched surface of the opening C8 of the pixel defining layer 20 so as to reach an upper surface of the pixel defining layer 20.

The opposite electrode 122 is provided on the organic emission layer 121 and the pixel defining layer. In the organic light-emitting display apparatus 1 according to the present embodiment, the pixel electrode 120 is used as an anode and the opposite electrode 122 is used as a cathode. However, polarities of the pixel electrode 120 and the opposite electrode 122 may be reversed.

The opposite electrode 122 may be a reflective electrode including a reflective material. The opposite electrode 122 may include one or more materials selected from Al, Mg, Li, Ca, lithium fluoride/calcium (LiF/Ca) and lithium fluoride/aluminum (LiF/Al). As the opposite electrode 122 is provided as a reflective electrode, light that is emitted from the organic emission layer 121 is reflected by the opposite electrode 122 and passes through the pixel electrode 120 which is a semi-transmissive metal. Thus, the light is emitted in the direction toward the substrate 10.

In embodiments, the opposite electrode 122 is not individually formed in each pixel but provided as a common electrode that covers as one the whole display area DA shown in FIG. 1.

Light that is emitted in the direction of the substrate 10, by micro-cavity structure, may have a color shift phenomenon. The color shift phenomenon may be influenced by a material and a thickness of the interlayer insulating layer 15. In the present embodiment, the entire thickness of the interlayer insulating layer 15 is about 6,000 Å in which a silicon oxide film that is about 4,000 Å thick is formed on a side of the interlayer insulating layer 15 close to the substrate 10 and a silicon nitride film that is about 2,000 Å thick is formed on the other side of the interlayer insulating layer 15 close to the pixel electrode 120 such that the silicon oxide film is disposed between the substrate and the silicon nitride film. In this case, the color shift phenomenon has improved compared to a structure in which a silicon oxide layer and a silicon nitride layer that are respectively about 3,000 Å thick are formed as an interlayer insulating layer.

In the capacitor area CAP1, a capacitor including a first electrode 314 and a second electrode 316 is provided. The first electrode 314 is disposed on the gate insulation layer 13 on which the gate electrode 214 is disposed and is formed of the same material as the gate electrode 214. The second electrode 316 is disposed on the interlayer insulating layer on which the source electrode 216a and the drain electrode 216b are disposed and is formed of the same material as the source electrode 216a and the drain electrode 216b. The interlayer insulating layer 15 is disposed between the first electrode 314 and the second electrode 316.

The pad area PAD1 includes a pad electrode 416 which is a connection terminal of an external driver. The pad area PAD1 is positioned at a periphery of the display area DA.

The pad electrode 416 is formed of the same material as the source electrode 216a, the drain electrode 216b, and the second electrode 316 of the capacitor.

The pad electrode 416 is positioned on the interlayer insulating layer 15, and edge portions of the pad electrode 416 are covered by the pixel defining layer 20. A portion of the pixel defining layer 20 that covers the edge portions of the pad electrode 416 is substantially thinner than a portion of the pixel defining layer 20 that covers the source and drain electrodes 216a and 216b and the second electrode 316.

By covering the edge portions of the pad electrode 416, the pixel defining layer 20 protects the edge portion of the pad electrode 416 from being degraded. However, if the pixel defining layer 20 is too thick at the proximity of the pad electrode, connection errors may occur when the external driver connects to the pad electrode 416. Accordingly, the portion of the pixel defining layer 20 that covers the edge portions of the pad electrode 416 needs to be thinner than the portion of the pixel defining layer 20 that covers the source electrode 216a and the drain electrode 216b.

Meanwhile, in embodiments, the organic light-emitting display apparatus 1 according to the present embodiment may further include an encapsulation member for encapsulating a display area including the pixel area PXL1, the capacitor area CAP1, and the thin film transistor area TR1. The encapsulation member may be formed of a substrate including a glass material, a metal film, an encapsulation thin film in which an organic insulating film and an inorganic insulating film are alternated, or the like.

Hereinafter, a method of manufacturing the organic light-emitting display apparatus 1 according to the present embodiment will be described with reference to FIGS. 3A through 3F.

Figure 3A:
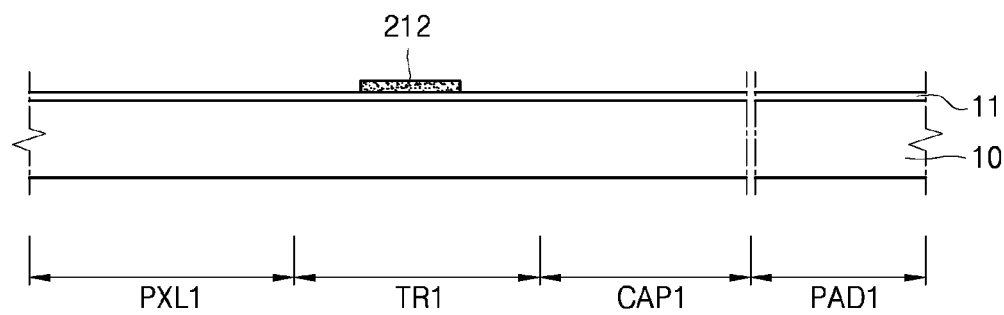
FIGS. 3A through 3F are cross-sectional views that schematically illustrate a method of manufacturing the organic light-emitting display apparatus of FIG. 1.

FIG. 3A is a cross-sectional view that schematically illustrates an outcome of a first mask process of the organic light-emitting display apparatus 1.

Referring to FIG. 3A, after a buffer layer 11 is formed on a substrate 10 and a semiconductor layer is formed on the buffer layer 11, the semiconductor layer is patterned to form an active layer 212 of a thin film transistor.

In embodiments, after a photoresist is coated on the semiconductor layer, the semiconductor layer is patterned by a photolithography process in which a first photomask is used. Thus, the above-described active layer 212 is formed. A first process by photolithography goes through a series of processes such as developing, etching, and stripping or ashing after the first photomask is exposed to light by using an exposure apparatus.

The semiconductor layer may be formed of amorphous silicon or crystalline silicon. The crystalline silicon may be formed by crystallizing amorphous silicon. Amorphous silicon may be crystallized by various methods such as rapid thermal annealing (RTA) method, solid phase crystallization (SPC) method, excimer laser annealing (ELA) method, metal induced crystallization (MIC) method, metal induced lateral crystallization (MILC) method, and sequential lateral solidification (SLS) method. Meanwhile, the semiconductor layer is not limited to amorphous silicon or crystalline silicon and may include an oxide semiconductor.

Figure 3B:
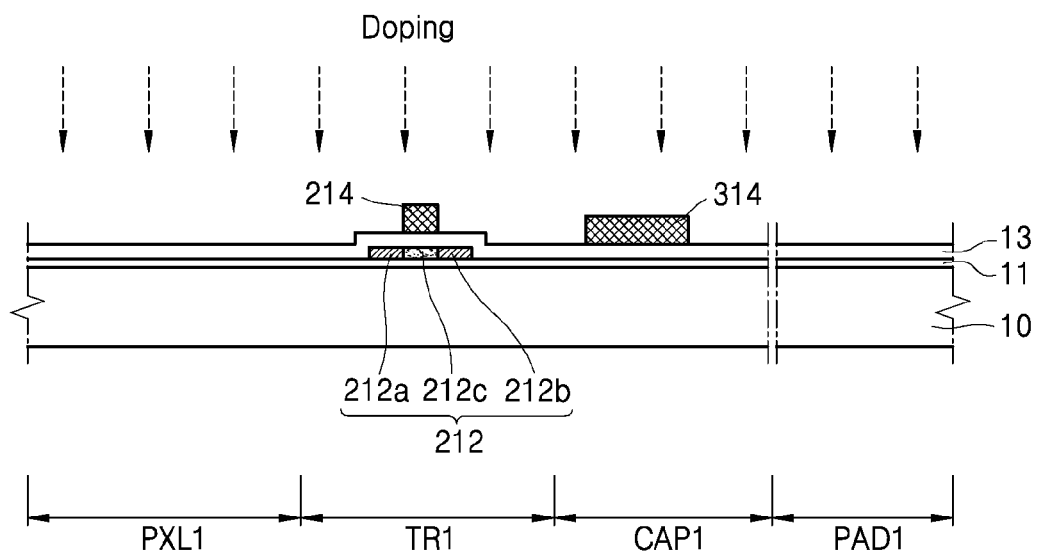

FIG. 3B is a cross-sectional view that schematically illustrates an outcome of a second mask process of the organic light-emitting display apparatus 1.

A gate insulating layer 13 is formed on a result of the first mask process of FIG. 3A, and a first metal layer is formed on the gate insulating layer 13 and then patterned. The first metal layer is laminated and then patterned. The first metal layer may be formed of one or more materials selected from Al, Pt, Pd, Ag, Mg, Au, Ni, Nd, Ir, Cr, Li, Ca, Mo, Ti, W, and Cu as a single layer or a multiple layer.

As a result of patterning, a gate electrode 214 and a first electrode 314 of a capacitor are formed on the gate insulating layer 13.

Ion impurities are implanted onto a structure as described above. B or P ions may be used as ion impurities, and the ion impurities are implanted at a concentration that is equal to or greater than $1 \times 10^{15}$ atoms/cm$^2$ with targeting the active layer 212 of the thin film transistor.

As the active layer 212 is doped with ion impurities by using the gate electrode 214 as a self-aligned mask, the active layer 212 comes to have a source region 212a and a drain region 212b which are doped with ion impurities and a channel region 212c between the source region 212a and the drain region 212b.

Figure 3C:
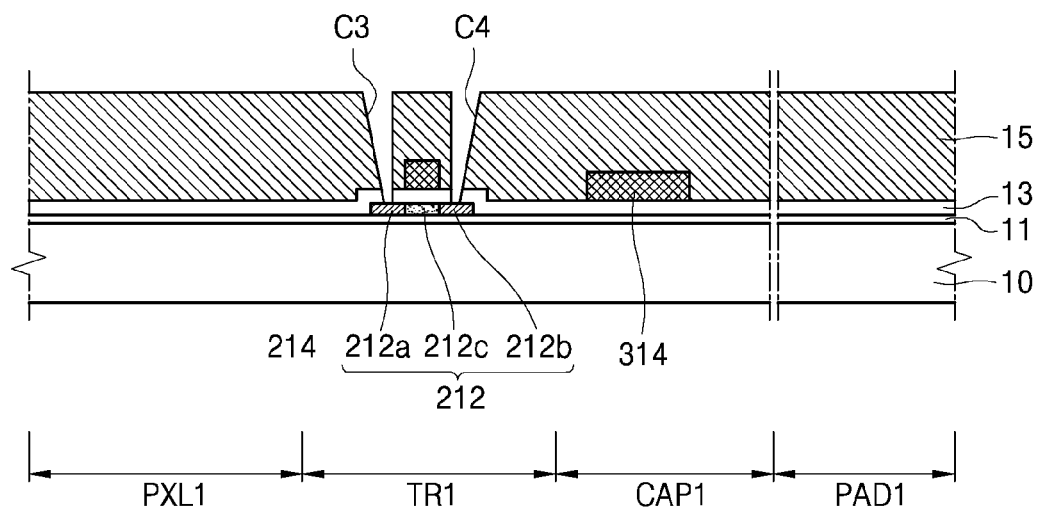

FIG. 3C is a cross-sectional view that schematically illustrates an outcome of a third mask process of the organic light-emitting display apparatus 1.

An interlayer insulating layer 15 is formed on a result of the second mask process of FIG. 3B, and the interlayer insulating layer 15 is patterned to form openings C3 and C4 exposing the source region 212a and the drain region 212b of the active layer 212.

Figure 3D:
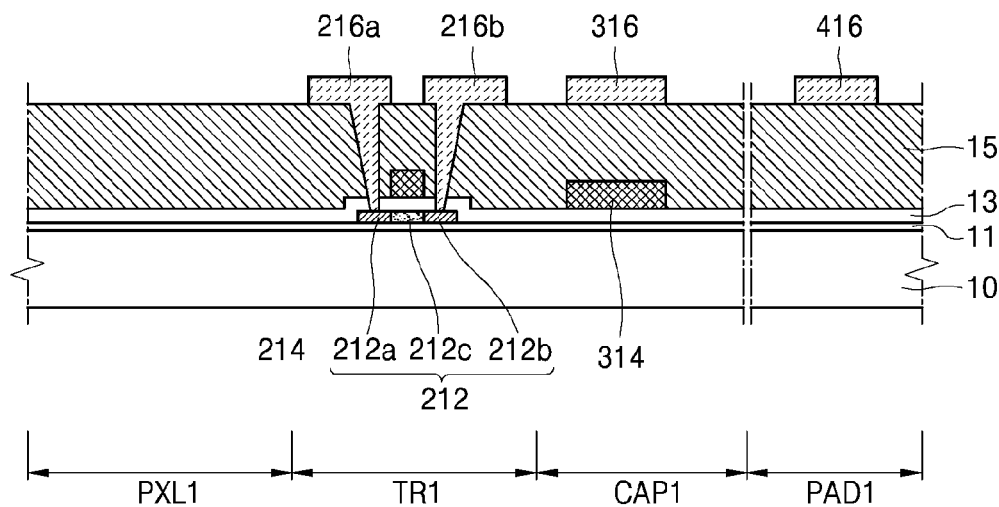

FIG. 3D is a cross-sectional view that schematically illustrates an outcome of a fourth mask process of the organic light-emitting display apparatus 1.

Referring to FIG. 3D, a second metal layer is formed on a result of the third mask process of FIG. 3C, and the second metal layer is patterned to form a source electrode 216a, a drain electrode 216b, a second electrode 316 of the capacitor, and a pad electrode 416 simultaneously.

The second metal layer may include two or more sub-layers. In embodiments, the second metal layer may be formed of different kinds of metal sub-layers that have different electron mobility. For example, each of metal sub-layers may be selected from Al, Pt, Pd, Ag, Mg, Au, Ni, Nd, Ir, Cr, Li, Ca, Mo, Ti, W, Cu, and any alloy thereof.

Figure 3E:
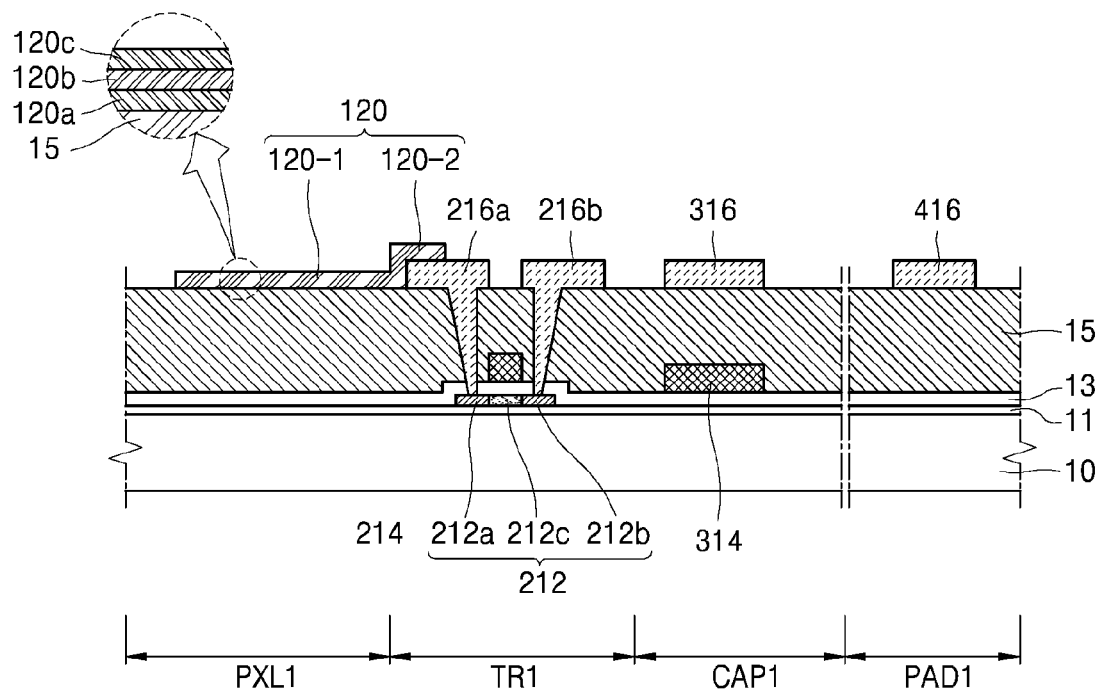

FIG. 3E is a cross-sectional view that schematically illustrates an outcome of a fifth mask process of the organic light-emitting display apparatus 1.

Referring to FIG. 3E, a first transparent conductive oxide layer 120a, a semi-transmissive metal layer 120b, and a second transparent conductive oxide layer 120c are sequentially formed on a result of the fourth process of FIG. 3D and are simultaneously patterned to form a pixel electrode 120.

A first region 120-1 of the pixel electrode 120 is in direct contact with an upper surface of the interlayer insulating layer 15 in an area that does not overlap either the thin film transistor or the capacitor.

A second region 120-2 of the pixel electrode 120 is in direct contact with an upper surface of the source electrode 216a.

If the pixel electrode 120 including a metal having strong reducibility such as Ag is patterned at the same time with patterning of the source electrode 216a, the drain electrode 216b, the second electrode 316, and the pad electrode 416, an etching process may take longer time and a lot of Ag particles may be generated. The Ag particles may cause particle-type defects that may create darks spots. However, in the present embodiment, patterning of the pixel electrode 120 is performed in a separate process or step after the source electrode 216a, the drain electrode 216b, the second electrode 316, and the pad electrode 416 are patterned. Thus, generation of Ag particles may be reduced.

Figure 3F:
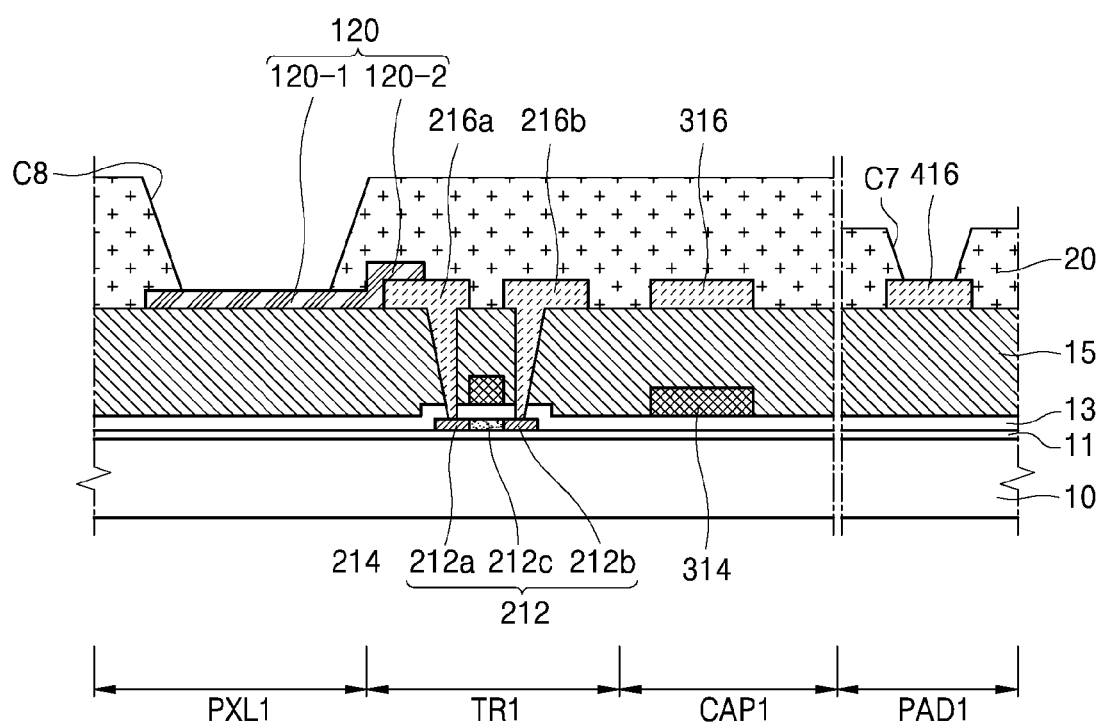

FIG. 3F is a cross-sectional view that schematically illustrates an outcome of a sixth mask process of the organic light-emitting display apparatus 1.

Referring to FIG. 3F, a sixth process in which, after a pixel defining layer 20 is formed on a result of the fifth process of FIG. 3E, an opening C8 exposing the first region 120-1 of the pixel electrode 120 and an opening C7 exposing the pad electrode 416 are formed is performed.

The pixel defining layer 20 may be formed of an organic insulating layer including, for example, a general-purpose polymer such as poly(methyl methacrylate) (PMMA) or polystyrene (PS), a polymer derivative having a phenol group, an acryl-based polymer, an imide-based polymer, an aryl ether-based polymer, an amide-based polymer, a fluorine-based polymer, a p-xylene based polymer, a vinyl alcohol-based polymer, or any blend thereof.

By using a half-tone mask, a portion of the pixel defining layer 20 that covers an edge portion of the pad electrode 416 is formed thinner than a portion of the pixel defining layer 20 that covers the source electrode 216a, the drain electrode 216b, and the second electrode 316 disposed in a thin film transistor area TR1 and a capacitor area CPA1. If the portion of the pixel defining layer 20 that covers the edge portion of the pad electrode 416 is too thick, connection errors may occur when the external driver connects to the pad electrode 416.

An intermediate layer including the organic emission layer 121 (refer to FIG. 2) is formed on a result of the sixth mask process of FIG. 3F, and an opposite electrode 122 is formed as a reflective electrode on the organic emission layer 121.

The organic light-emitting display apparatus 1 may have the pixel electrode 120 formed as a semi-transmissive metal layer 120b and the opposite electrode 122 formed as a reflective electrode, thereby improving luminescent efficiency of the organic light-emitting display apparatus 1 by a micro-cavity.

Also, an organic light-emitting display apparatus may be manufactured by six mask processes and thus, manufacturing costs may be reduced.

As described above, according to one or more of the above embodiments, an organic light-emitting display apparatus which may have reduced manufacturing costs and a method of manufacturing the organic light-emitting display apparatus are provided.

While one or more embodiments have been described with reference to the figures, it will be understood by those of ordinary skill in the art that various changes in form and details may be made therein without departing from the spirit and scope of the inventive concept as defined by the following claims.

What is claimed is:

1. An organic light-emitting display apparatus comprising:
    a substrate comprising a major surface;
    an active layer formed over the substrate;
    a gate insulating layer formed over the active layer;
    a gate electrode formed over the gate insulating layer for providing a thin-film transistor comprising the gate electrode and the active layer;
    a first capacitor electrode formed over the gate insulating layer;
    an interlayer insulating layer formed over the gate insulation layer, the gate electrode and the first electrode;
    a source electrode and a drain electrode formed over the interlayer insulating layer;
    a second capacitor electrode formed over the interlayer insulating layer for providing a capacitor comprising the first and second capacitor electrode, the second capacitor electrode being formed of the same material as the source electrode and the drain electrode;
    a pixel electrode comprising a first portion formed on and directly contacting an upper surface of the interlayer insulating layer and a second portion connecting the first portion and one of the source electrode and the drain electrode;
    a pixel defining layer formed over the interlayer insulating layer and covering the source and drain electrodes and the second capacitor electrode, the pixel defining layer comprising an opening which at least partly exposes the first portion of the pixel electrode therethrough, wherein the opening does not overlap any of the active layer, the gate electrode, the first capacitor electrode and the second capacitor electrode when viewed in a viewing direction perpendicular to the major surface, wherein the second portion of the pixel electrode directly contacts an upper surface of one of the source and drain electrodes, and wherein the upper surface directly contacts the pixel defining layer;
    an organic light emission layer formed over the pixel electrode; and
    an opposite electrode formed over the organic light emission layer.

2. The apparatus of claim 1, wherein the pixel electrode comprises a first transparent conductive oxide layer, a semi-transmissive metal layer, and a second transparent conductive oxide layer that are sequentially stacked over the substrate.

3. The apparatus of claim 2, wherein the first and second transparent conductive oxide layers comprise at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

4. The apparatus of claim 2, wherein the semi-transmissive metal layer comprises one selected from silver (Ag) and an Ag alloy.

5. The apparatus of claim 1, wherein the interlayer insulating layer comprises a silicon oxide film and a silicon nitride film that are sequentially stacked over the substrate such that the silicon oxide film is disposed between the substrate and the silicon nitride film.

6. The apparatus of claim 1, further comprising a pad electrode formed over the interlayer insulating layer and formed of the same material as the source electrode, the drain electrode, and the second capacitor electrode.

7. The apparatus of claim 6, wherein the pixel defining layer covers an edge portion of the pad electrode.

8. The apparatus of claim 7, wherein the pixel defining layer comprises a first portion covering the edge portion of the pad electrode and a second portion covering the source electrode and the drain electrode, wherein the first portion is substantially thinner than the second portion.

9. The apparatus of claim 1, wherein the pixel defining layer comprises an organic insulating material.

10. A method of manufacturing an organic light-emitting display apparatus, the method comprising:
- forming an active layer over a substrate;
- forming a gate insulating layer over the substrate and the active layer;
- forming a gate electrode and a first capacitor electrode over the gate insulating layer, thereby providing a thin film transistor comprising the active layer and the gate electrode;
- forming an interlayer insulating layer over the gate insulating layer, the gate electrode and the first capacitor layer;
- forming a source electrode, a drain electrode, and a second capacitor electrode over the interlayer insulating layer;
- forming a pixel electrode over the interlayer insulating layer, the pixel electrode comprising a first portion formed on and directly contacting an upper surface of the interlayer insulating layer and a second portion connecting the first portion and one of the source electrode and the drain electrode; and
- forming a pixel defining layer over the interlayer insulating layer, the pixel defining layer covering the source electrode, the drain electrode, and an edge portion of the pixel electrode,
- wherein the second portion of the pixel electrode directly contacts an upper surface of one of the source and drain electrodes, and wherein the upper surface directly contacts the pixel defining layer.

11. The method of claim 10, wherein, after forming the gate electrode, a region of the active layer that does not overlap the gate electrode when viewed in a viewing direction perpendicular to a major surface of the substrate is doped with an ion impurity.

12. The method of claim 10, wherein the pixel defining layer comprises an opening at least partly exposing the first portion of the pixel electrode therethrough, wherein the opening does not overlap any of the active layer, the gate electrode, the first capacitor electrode and the second capacitor electrode when viewed in a viewing direction perpendicular to a major surface of the substrate.

13. The method of claim 10, wherein the pixel electrode comprises a first transparent conductive oxide layer, a semi-transmissive metal layer, and a second transparent conductive oxide layer that are sequentially stacked over the interlayer insulating layer.

14. The method of claim 13, wherein the semi-transmissive metal layer comprises one selected from silver (Ag) and an Ag alloy.

15. The method of claim 13, wherein the first and second transparent conductive oxide layers comprise at least one selected from a group consisting of ITO, IZO, ZnO, $In_2O_3$, IGO, and AZO.

16. The method of claim 10, wherein, when forming the source electrode, the drain electrode, and the second capacitor electrode, a pad electrode, the source electrode, the drain electrode, and the second capacitor electrode are simultaneously formed over the interlayer insulating layer.

17. The method of claim 16, wherein the pixel defining layer comprises a first portion covering the edge portion of the pad electrode and a second portion covering the source electrode and the drain electrode, wherein the first portion is substantially thinner than the second portion.

18. The method of claim 17, wherein the first portion of the pixel defining layer is formed by using a half-tone mask.

* * * * *